(12) United States Patent
Kim et al.

(10) Patent No.: US 10,903,005 B2
(45) Date of Patent: Jan. 26, 2021

(54) COMPOSITE ELECTRONIC COMPONENT

(71) Applicant: SAMSUNG ELECTRO-MECHANICS CO., LTD., Suwon-si (KR)

(72) Inventors: Hae In Kim, Suwon-si (KR); Eun Ju Oh, Suwon-si (KR); Yong Sung Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 18 days.

(21) Appl. No.: 16/168,038

(22) Filed: Oct. 23, 2018

(65) Prior Publication Data

US 2020/0005998 A1 Jan. 2, 2020

(30) Foreign Application Priority Data

Jun. 28, 2018 (KR) ........................ 10-2018-0074975

(51) Int. Cl.
| | | |
|---|---|---|
| *H01G 4/40* | (2006.01) | |
| *H01G 4/38* | (2006.01) | |
| *H01G 4/12* | (2006.01) | |
| *H01G 2/06* | (2006.01) | |
| *H01G 2/22* | (2006.01) | |
| *H05K 1/18* | (2006.01) | |

(Continued)

(52) U.S. Cl.
CPC .............. *H01G 4/12* (2013.01); *H01G 2/065* (2013.01); *H01G 2/22* (2013.01); *H01G 4/012* (2013.01); *H01G 4/30* (2013.01); *H01G 4/40* (2013.01); *H05K 1/181* (2013.01); *H01G 4/38* (2013.01); *H05K 1/0259* (2013.01)

(58) Field of Classification Search
None
See application file for complete search history.

(56) References Cited

U.S. PATENT DOCUMENTS

| | | | | | |
|---|---|---|---|---|---|
| 5,870,273 | A | * | 2/1999 | Sogabe | ..................... H01G 4/40 361/306.3 |
| 5,999,398 | A | * | 12/1999 | Makl | ........................ H01G 4/35 338/20 |

(Continued)

FOREIGN PATENT DOCUMENTS

| | | |
|---|---|---|
| KR | 10-2010-0049846 A | 5/2010 |
| KR | 10-2015-0135909 A | 12/2015 |

(Continued)

OTHER PUBLICATIONS

Notice of Office Action issued in Korean Patent Application No. 10-2018-0074975, dated Oct. 28, 2019 (with English translation).

*Primary Examiner* — Dion Ferguson
(74) *Attorney, Agent, or Firm* — Morgan, Lewis & Bockius LLP

(57) ABSTRACT

A composite electronic component includes a capacitor including a capacitor body including a dielectric layer and first and second internal electrodes alternately stacked with the dielectric layer interposed therebetween, and first and second electrodes disposed on the capacitor body, and a varistor including a varistor body including ZnO and third and fourth electrodes disposed on the varistor body, wherein the first electrode is electrically connected to the third electrode and the second electrode is electrically connected to the fourth electrode.

7 Claims, 6 Drawing Sheets

(51) Int. Cl.
  *H01G 4/30* (2006.01)
  *H01G 4/012* (2006.01)
  *H05K 1/02* (2006.01)

(56) References Cited

U.S. PATENT DOCUMENTS

| | | | | |
|---|---|---|---|---|
| 7,428,137 | B2* | 9/2008 | Dowgiallo, Jr. | H01G 4/12 |
| | | | | 361/301.5 |
| 7,623,020 | B2* | 11/2009 | Koyama | H01C 7/18 |
| | | | | 338/20 |
| 8,134,447 | B2* | 3/2012 | Pecina | H01C 7/18 |
| | | | | 338/308 |
| 9,072,178 | B2* | 6/2015 | Chung | H05K 1/0231 |
| 9,865,399 | B2* | 1/2018 | Cho | H01G 4/012 |
| 10,128,050 | B1* | 11/2018 | Park | H01G 4/232 |
| 2013/0016488 | A1* | 1/2013 | McConnell | H01G 4/232 |
| | | | | 361/774 |
| 2013/0343027 | A1* | 12/2013 | Perea | H01C 1/14 |
| | | | | 361/813 |
| 2015/0340154 | A1 | 11/2015 | Kim et al. | |
| 2016/0133386 | A1* | 5/2016 | Park | H01G 4/12 |
| | | | | 361/767 |
| 2016/0205769 | A1* | 7/2016 | Park | H01G 4/236 |
| | | | | 174/260 |
| 2017/0278638 | A1* | 9/2017 | Hattori | H01G 2/06 |
| 2017/0346279 | A1 | 11/2017 | Son et al. | |
| 2019/0333700 | A1 | 10/2019 | Cho et al. | |

FOREIGN PATENT DOCUMENTS

| | | |
|---|---|---|
| KR | 10-1760877 B1 | 7/2017 |
| KR | 10-2017-0135667 A | 12/2017 |
| KR | 10-2017-0141631 A | 12/2017 |

* cited by examiner

COMPOSITE ELECTRONIC COMPONENT

CROSS-REFERENCE TO RELATED APPLICATION(S)

This application claims the benefit of priority to Korean Patent Application No. 10-2018-0074975 filed on Jun. 28, 2018 in the Korean Intellectual Property Office, the disclosure of which is incorporated herein by reference in its entirety.

TECHNICAL FIELD

The present disclosure relates to a composite electronic component.

BACKGROUND

In accordance with recent trends, portable electronic devices have increasingly used a case formed of a metallic material having conductivity and, accordingly, there has been an increasing need to resist internal and external electrical shocks of an electronic device.

In particular, a front surface of a portable electronic device has been increasingly manufactured using a metallic frame to enhance an aesthetic appearance and increase strength. In accordance with current trends, there has been an increasing need for an element for protecting an internal electronic component due to an external electrostatic discharge (ESD) or for preventing a user experiencing an electric shock due to internal power.

Accordingly, Korean Patent Publication No. 10-2017-0135667 discloses a composite electronic component configured in such a manner that an ESD protection device including first and second discharge electrodes and an ESD discharge layer is formed, using a printing method, on a multilayer ceramic capacitor (MLCC) to control widths of the first and second discharge electrodes and an interval between the first and second discharge electrodes, thereby achieving excellent durability against static electricity.

However, Korean Patent Publication No. 10-2017-0135667 has a problem in that a flowing current instantly increases to generate radiated noise during turn-on due to a very high standard deviation of an operating voltage and low element resistance after turn-on.

SUMMARY

An aspect of the present disclosure may provide a composite electronic component having excellent durability against static electricity and a low voltage standard deviation during turn-on and which prevents radiated noise from being generated.

According to an aspect of the present disclosure, a composite electronic component may include a capacitor including a capacitor body including a dielectric layer and first and second internal electrodes alternately stacked with the dielectric layer interposed therebetween, and first and second electrodes disposed on the capacitor body, and a varistor including a varistor body including ZnO and third and fourth electrodes disposed on the varistor body, wherein the first electrode is electrically connected to the third electrode and the second electrode is electrically connected to the fourth electrode.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
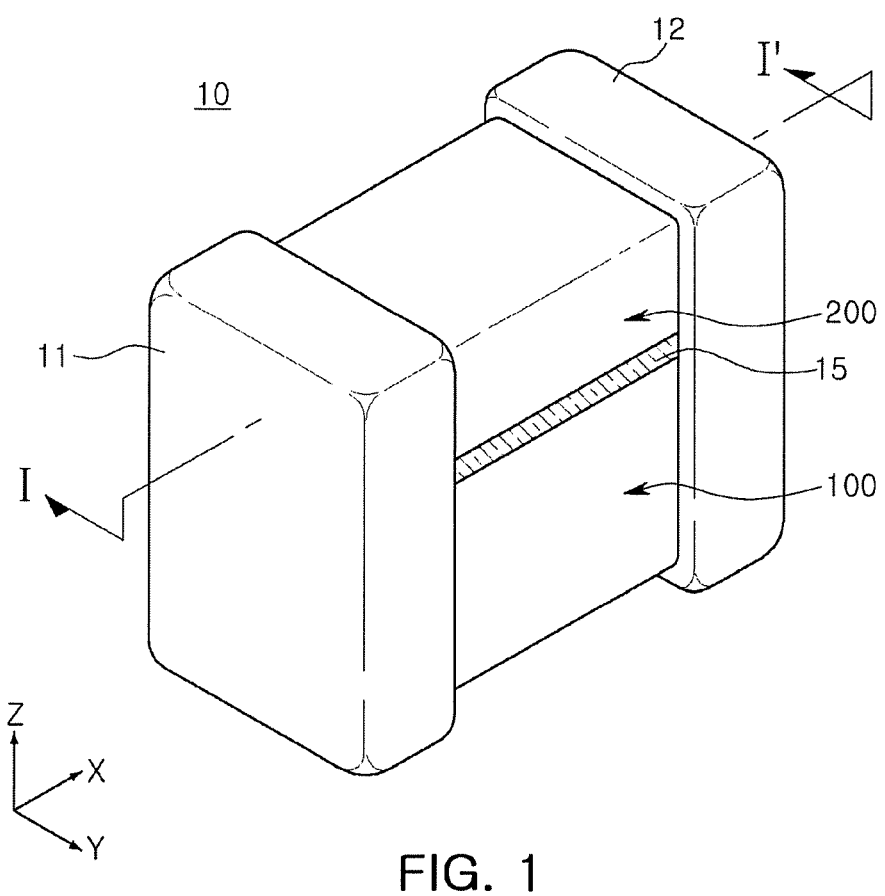
FIG. 1 is a schematic perspective view of a composite electronic component according to an exemplary embodiment of the present disclosure.

Hereinafter, exemplary embodiments of the present disclosure will be described in detail with reference to the accompanying drawings.

In the drawings, the X direction is understood as being a first direction or a longitudinal direction, the Y direction is understood as being a second direction or a width direction, and the Z direction is understood as being a third direction, a thickness direction, or a stack direction but the present disclosure is not limited thereto.

Composite Electronic Component

Figure 2:
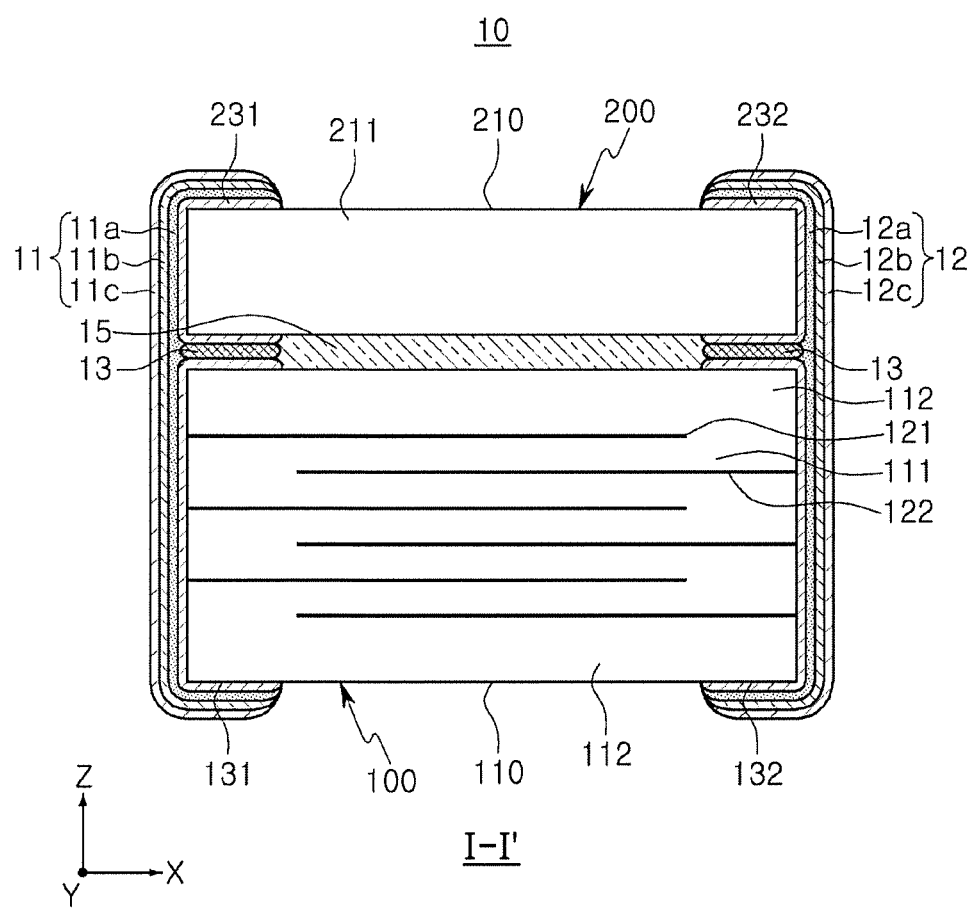
FIG. 2 is a cross-sectional view taken along a line I-I' of FIG. 1.

FIG. 1 is a schematic perspective view of a composite electronic component according to an exemplary embodiment of the present disclosure. FIG. 2 is a cross-sectional view taken along a line I-I' of FIG. 1.

Hereinafter, a composite electronic component 10 according to an exemplary embodiment of the present disclosure is described with reference to FIGS. 1 and 2.

The composite electronic component 10 according to an exemplary embodiment of the present disclosure may be a complex formed by coupling a capacitor 100 and a varistor 200.

The capacitor 100 may include a capacitor body 110 including a dielectric layer 111 and first and second internal electrodes 121 and 122 that are alternately arranged across the dielectric layer 111, and first and second electrodes 131 and 132 disposed on the capacitor body 110.

The capacitor body 110 may be formed by stacking the plurality of dielectric layers 111 in the thickness direction (the Z direction) and, then, sintering the dielectric layers 111, and the shape and dimension of the capacitor body 110 and the number of the stacked dielectric layers 111 are not limited to the embodiment illustrated in the drawings.

The capacitor body 110 may have first and second surfaces opposing each other in the thickness direction (the Z direction), third and fourth surfaces that are connected to the first and second surfaces and face each other in the longitudinal direction (the X direction), and fifth and sixth surfaces that are connected to the first and second surfaces, are connected to the third and fourth surfaces, and face each other in the width direction (the Y direction).

The plurality of dielectric layers 111 forming the capacitor body 110 are in a sintered state and may be integrated with each other in such a manner that it is difficult to determine a boundary between adjacent dielectric layers 111 without the use of a scanning electron microscope (SEM).

A material of the dielectric layer 111 is not particularly limited as long as sufficient capacitance is acquirable and may be, for example, barium titanate ($BaTiO_3$) powder. A material for forming the dielectric layer 111 may be formed by adding various ceramic additives, organic solvents, plasticizers, bonding agents, dispersants, or the like to powder such as barium titanate ($BaTiO_3$) according to the objective of the present disclosure.

The capacitor body 110 may include a cover layer 112 that is formed at each of upper and lower portions thereof and is formed by stacking dielectric layers without an internal electrode. The cover layer 112 may maintain the reliability of a capacitor with respect to external shocks.

Referring to FIG. 2, the capacitor body 110 may include the dielectric layer 111 and the first and second internal electrodes 121 and 122 that are alternately exposed through the third and fourth surfaces of the capacitor body 110 across the dielectric layer 111.

The first and second internal electrodes 121 and 122 may be a pair of electrodes with different polarities and may be electrically insulated from each other by the dielectric layer 111 disposed therebetween.

The first and second internal electrodes 121 and 122 may be alternately exposed through the third and fourth surfaces opposing each other in the longitudinal direction (the X direction) of the capacitor body 110 and, thus, may be connected to the first and second electrodes 131 and 132 disposed outside the capacitor body 110, respectively.

The first and second internal electrodes 121 and 122 may include nickel (Ni), copper (Cu), palladium (Pd), silver (Ag), lead (Pb), platinum (Pt), or the like alone or a conductive metal of an alloy thereof.

The first and second electrodes 131 and 132 may include nickel (Ni), copper (Cu), palladium (Pd), silver (Ag), lead (Pb), platinum (Pt), or the like alone or a conductive metal of an alloy thereof. A method of forming the first and second electrodes 131 and 132 is not particularly limited and, for example, may be formed by coating conductive paste or may be formed using a sputtering method, atomic layer deposition (ALD), or the like.

The varistor 200 may include a varistor body 210 including ZnO and third and fourth electrodes 231 and 232 disposed on the varistor body 210. ZnO has insulating properties at a turn-on voltage or less but has conductivity when a higher voltage than the turn-on voltage is applied and, thus, ZnO provides current between the third electrode 231 and the fourth electrode 232 to embody a varistor function.

The varistor body 210 may be formed by stacking a plurality of dielectric layers 211 including ZnO in the thickness direction (the Z direction) and, then, sintering the dielectric layers 211, and the shape and dimension of the varistor body 210 and the stack number of the dielectric layers 211 are not limited to the embodiment illustrated in the drawings. The varistor body 210 may be formed of ZnO as a main component.

A material for forming the dielectric layers 211 including ZnO is not particularly limited as long as the varistor function is embodied. For example, a particle size of power including ZnO as a main component, additives, a process condition, or the like may be controlled to ensure a target turn-on voltage.

The third and fourth electrodes 231 and 232 may include nickel (Ni), copper (Cu), palladium (Pd), silver (Ag), lead (Pb), platinum (Pt), or the like alone or a conductive metal of an alloy thereof. A method of forming the third and fourth electrodes 231 and 232 is not particularly limited and, for example, may be formed by coating conductive paste or may be formed using a sputtering method, atomic layer deposition (ALD), or the like.

The capacitor 100 and the varistor 200 may configure the composite electronic component 10 by electrically connecting the first electrode 131 of the capacitor 100 and the third electrode 231 of the varistor 200 and electrically connecting the second electrode 132 of the capacitor 100 and the fourth electrode 232 of the varistor 200.

Conventionally, a suppressor-type electrostatic discharge (ESD) protection device including first and second discharge electrodes and an ESD discharge layer is formed on a capacitor using a printing method to configure a composite electronic component. In this case, since the ESD discharge layer includes silicon (Si) as a main component, an instantly flowing current abruptly increases to generate radiated noise during turn-on due to a very high standard deviation of an operating voltage and low element resistance after turn-on and, thus, there is a problem in that a surrounding circuit is affected and soft-fail may occur.

On the other hand, according to the present disclosure, the separately manufactured varistor 200 formed of ZnO as a main component may be coupled to the capacitor 100 to configure the composite electronic component and, thus, a voltage standard deviation during turn-on is low and, accordingly, resistance during turn-on may be increased to prevent radiated noise from being generated.

Table 1 below shows a turn-on voltage that is measured with respect to a composite electronic component (Comparative Example) formed in such a manner that an ESD protection device including first and second discharge electrodes and an ESD discharge layer formed of silicon (Si) as a main component is formed on a capacitor using a printing method and a composite electronic component (Inventive Example) formed by coupling a separately manufactured varistor formed of ZnO as a main component with a capacitor.

Comparative Example 1 shows an average value, a maximum value, a minimum value, a difference between the maximum and minimum values, and a standard deviation (Stdev) of a turn-on voltage measured with respect to 20 samples of Comparative Example, which are manufactured in the same way. Comparative Example 2 shows an average value, a maximum value, a minimum value, a difference between the maximum and minimum values, and a Stdev of a turn-on voltage that is measured 20 times with respect to one sample of Comparative Example.

Inventive Example 1 shows an average value, a maximum value, a minimum value, a difference between the maximum and minimum values, and a Stdev of a turn-on voltage measured with respect to 20 samples of Inventive Example, which are manufactured in the same way. Inventive Example 2 shows an average value, a maximum value, a minimum value, a difference between the maximum and minimum values, and a Stdev of a turn-on voltage that is measured 20 times with respect to one sample of Inventive Example.

Figure 3:
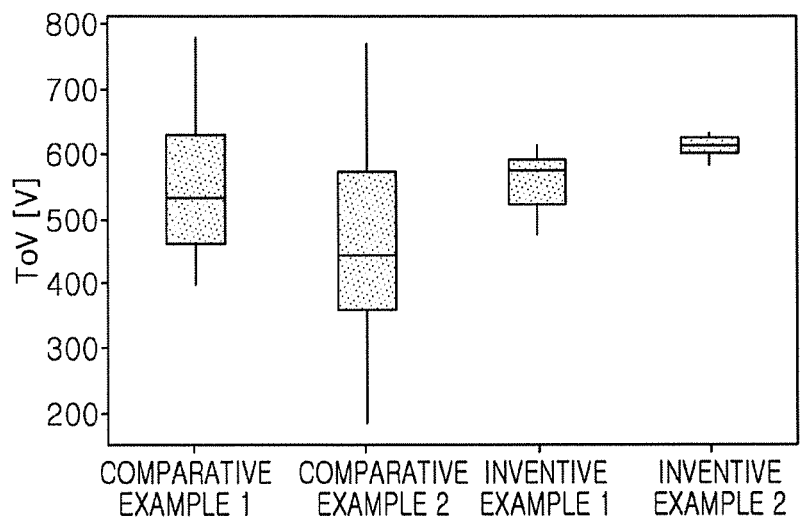
FIG. 3 is a diagram showing various values of a turn-on voltage that are shown in Table 1 below.
Figure 4:
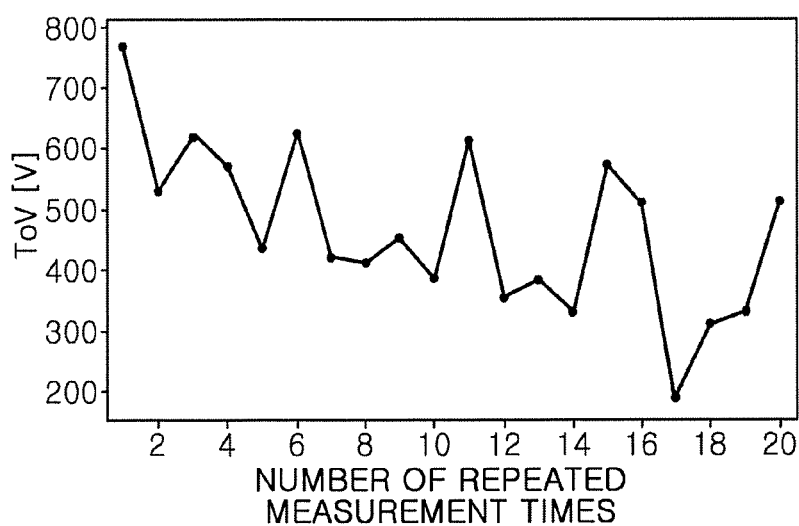
FIG. 4 is a diagram showing a relationship between a measured value of a turn-on voltage and the number of repeated measurement times according to Comparative Example 2.

FIG. 3 is a diagram showing various values of a turn-on voltage that are shown in Table 1 below. FIG. 4 is a diagram showing a relationship between a measured value of a turn-on voltage and the number of repeated measurement times according to Comparative Example 2. In FIGS. 3 and 4, ToV refers to a turn-on voltage.

TABLE 1

|  | Comparative Example | | Inventive Example | |
| --- | --- | --- | --- | --- |
| Turn-on voltage | Comparative Example 1 | Comparative Example 2 | Inventive Example 1 | Inventive Example 2 |
| Average value (V) | 559 | 467 | 561 | 611 |
| Maximum value (V) | 779 | 772 | 613 | 633 |
| Minimum value (V) | 400 | 187 | 477 | 587 |
| Maximum value − Minimum value (V) | 379 | 585 | 136 | 46 |
| Stdev | 113 | 139 | 41 | 13 |

As seen from Table 1 and FIG. 1, a Stdev in Comparative Example is greater than 100 but a Stdev in Inventive Example is equal to or less than 50 and, thus, a Stdev of a turn-on voltage is remarkably lowered.

In particular, it may be seen that a Stdev measured with respect to the 20 samples of Comparative Example 1 are about three times higher than a Stdev measured with respect to the 20 sample of Inventive Example 1 but that a Stdev that is measured 20 times with respect to the one sample is ten or more times higher than a Stdev that is measured 20 times with respect to the one sample.

As seen from FIG. 4, this is because a measured value in Comparative Example including an ESD discharge layer formed of silicon (Si) as a main component is gradually lowered along with repeated measurement. Accordingly, it may be seen that Inventive Example also has excellent durability against electrostatic discharge (ESD).

Accordingly, a Stdev of a turn-on voltage of the composite electronic component according to an exemplary embodiment of the present disclosure may be equal to or less than 50.

Figure 5A:
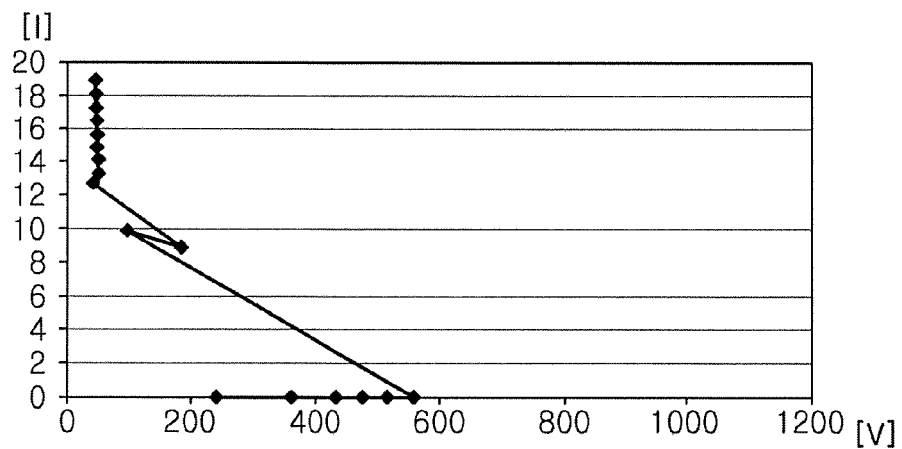
FIG. 5A is a diagram showing a relationship between the current (I) and the voltage (V) during turn-on according to Comparative Example.
Figure 5B:
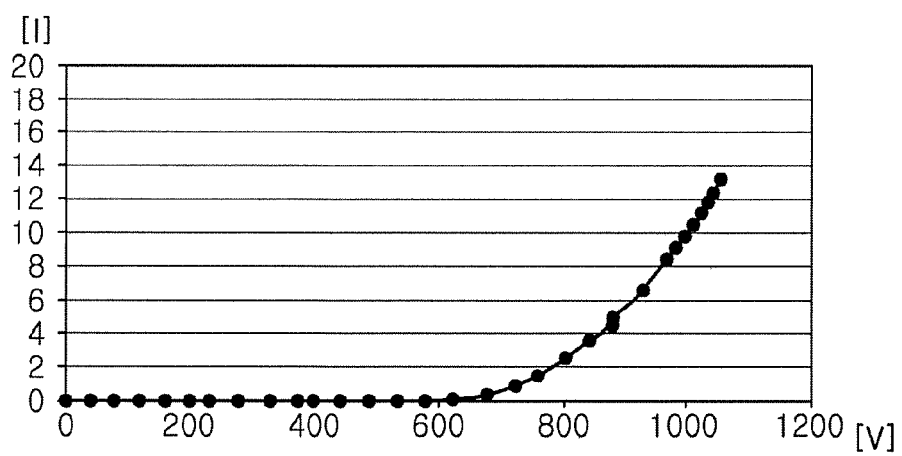
FIG. 5B is a diagram showing a relationship between the current (I) and the voltage (V) during turn-on according to Inventive Example.

FIG. 5A is a diagram showing a relationship between the current (I) and the voltage (V) during turn-on according to Comparative Example, and FIG. 5B is a diagram showing a relationship between the current (I) and the voltage (V) during turn-on according to Inventive Example. In FIG. 5, the X and Y axes indicate voltage and current applied to sample for each application step. A reference of turn-on is generally a point of time when current is greater than 0.01 A and resistance applied later to a sample is resistance during turn-on.

A turn-on time point of Comparative Example is a period having a predetermined voltage after about 570 V and a calculated resistance value of Comparative Example is R=48/15.7, i.e., about 3.1Ω.

A turn-on time point of the Inventive Example is after about 600 V and a calculated value of Inventive Example is R=895/6.5, i.e., about 138Ω.

It may be seen that, in the case of the Inventive Example, resistance after turn-on is very high and resistance is sufficient compared with Comparative Example and, thus, influence on a surrounding circuit during actual use may be minimized.

Accordingly, according to an exemplary embodiment of the present disclosure, the composite electronic component may have turn-on resistance that is equal to or greater than 100Ω.

According to an exemplary embodiment of the present disclosure, the composite electronic component 10 may include first and second external electrodes 11 and 12.

The first external electrode 11 may be disposed to cover the first electrode 131 of the capacitor and the third electrode 231 of the varistor 200 and the second external electrode 12 may be disposed to cover the second electrode 132 of the capacitor and the fourth electrode 232 of the varistor 200.

The first and second external electrodes 11 and 12 may couple the capacitor 100 and the varistor 200, may electrically connect the first electrode 131 and the third electrode 231, and may electrically connect the second electrode 132 and the fourth electrode 232 to function as a composite electronic component.

The first and second external electrodes 11 and 12 may include plating layers 11b, 11c, 12b, and 12c. The plating layers 11b, 11c, 12b, and 12c may enhance installation characteristics. The plating layers 11b, 11c, 12b, and 12c may be a Ni or Sn plating layer or may be formed as a multiple layer. For example, the first external electrode 11 may include the Ni plating layer 11b disposed to cover the first electrode 131 and the third electrode 231, and the Sn plating layer 11c formed on the Ni plating layer 11b. The second external electrode 12 may include the Ni plating layer 12b disposed to cover the second electrode 132 and the fourth electrode 232, and the Sn plating layer 12c formed on the Ni plating layer 12b.

The first and second external electrodes 11 and 12 may include electrode layers 11a and 12a and the plating layers 11b, 11c, 12b, and 12c formed on the electrode layers 11a and 12a, respectively.

As illustrated in FIG. 2, the electrode layers 11a and 12a may be disposed to cover the first and third electrodes 131 and 231 or the second and fourth electrodes 132 and 232 and the plating layers 11b, 11c, 12b, and 12c may be formed on the electrode layers 11a and 12a.

The electrode layers 11a and 12a may include nickel (Ni), copper (Cu), palladium (Pd), silver (Ag), lead (Pb), platinum (Pt), or the like alone or as a conductive metal formed of alloys thereof. A method of forming the electrode layers 11a and 12a is not particularly limited and, for example, may be formed by coating conductive paste or may be formed using a sputtering method, atomic layer deposition (ALD), or the like.

The electrode layers 11a and 12a may be formed of the same material as the first to fourth electrodes 131, 132, 231, and 232, thereby more firmly coupling the capacitor 100 and varistor 200.

The plating layers 11b, 11c, 12b, and 12c may be a Ni or Sn plating layer or may be formed as a multiple layer.

Conductive adhesives 13 may be disposed between the first electrode 131 and the third electrode 231 and between the second electrode 132 and the fourth electrode 232 to more firmly couple the capacitor 100 and the varistor 200.

Insulating adhesives 15 may be disposed between the varistor body 210 and the capacitor body 110 to more firmly couple the capacitor 100 and the varistor 200 and may prevent plating solution and impurities from penetrating between the varistor body 210 and the capacitor body 110.

Figure 6:
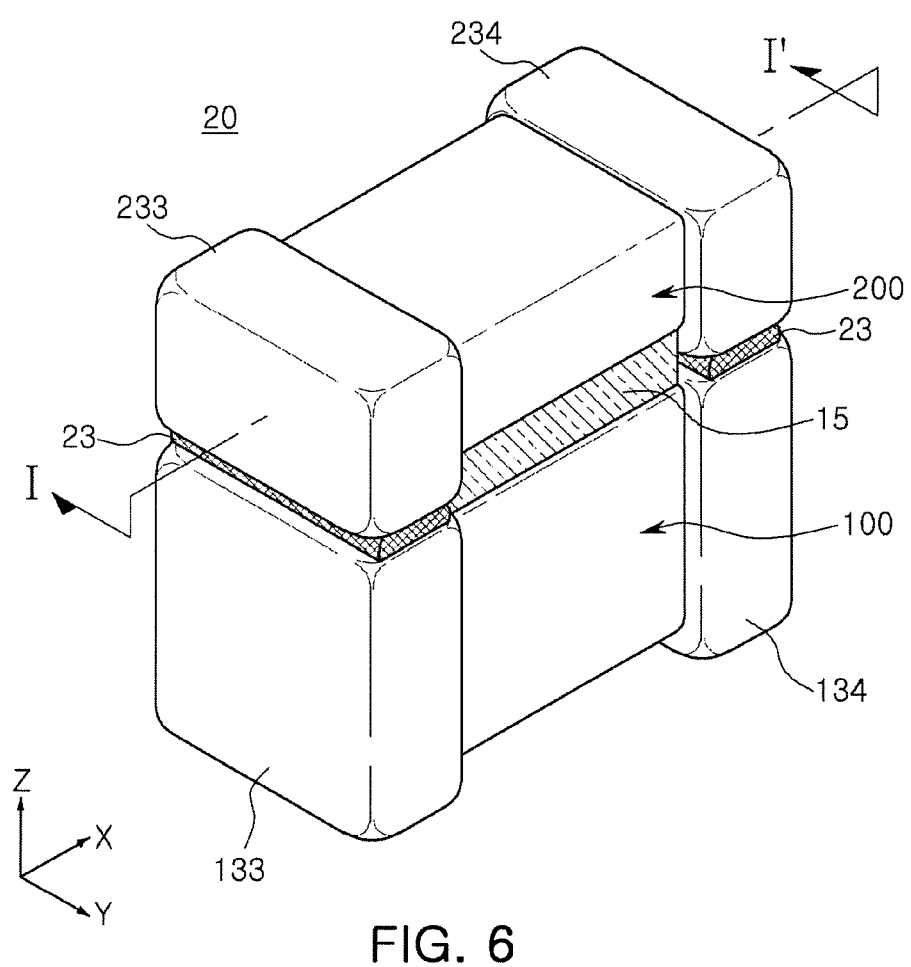
FIG. 6 is a schematic perspective view of a composite electronic component according to another exemplary embodiment of the present disclosure.
Figure 7:
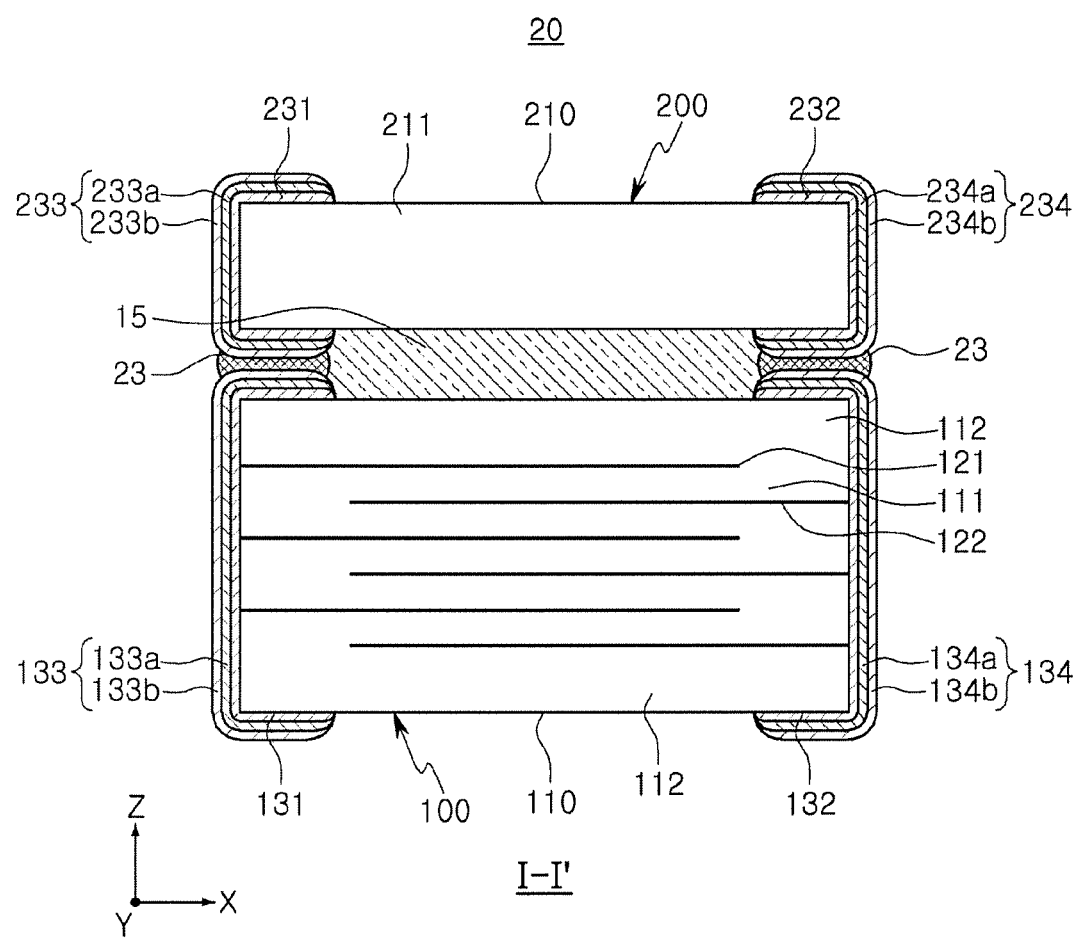
FIG. 7 is a cross-sectional view taken along I-I' of FIG. 6.

FIG. 6 is a schematic perspective view of a composite electronic component according to another exemplary embodiment of the present disclosure. FIG. 7 is a cross-sectional view taken along I-I' of FIG. 6.

Hereinafter, a composite electronic component 20 according to an exemplary embodiment of the present disclosure is described with reference to FIGS. 6 and 7. However, a repeated description of the above description is not given here.

The composite electronic component 20 according to another exemplary embodiment of the present disclosure may be configured in such a manner that first to fourth plating layers 133, 134, 233, and 234 are disposed on surfaces of first to fourth electrodes 131, 132, 231, and 232, respectively.

The plating layers 133, 134, 233, and 234 may be a Ni or Sn plating layer or may be formed as a multiple layer. For example, the first and second plating layers 133 and 134 may include Ni plating layers 133a and 134a disposed to cover the first and second electrodes 131 and 132, respectively, and Sn plating layers 133b and 134b formed on the Ni plating layers 133a and 134a. Likewise, the third and fourth plating layers 233 and 234 may include Ni plating layers 233a and 234a disposed to cover the third and fourth electrodes 231 and 232, respectively, and Sn plating layers 233b and 234b formed on the Ni plating layers 233a and 234a.

A solder 23 is disposed between the first plating layer 133 and the third plating layer 233 and between the second plating layer 134 and the fourth plating layer 234.

The solder 23 may bond plating layers to physically couple and electrically connect the capacitor 100 and the varistor 200.

The insulating adhesives 15 may be disposed between the varistor body 210 and the capacitor body 110 to more firmly couple the capacitor 100 and the varistor 200 and may prevent plating solution and impurities from penetrating between the varistor body 210 and the capacitor body 110.

As set forth above, according to an exemplary embodiment in the present disclosure, the composite electronic component may be configured in such a manner that the varistor is coupled to a capacitor to have excellent durability against static electricity, a low voltage Stdev during turn-on, and increased resistance during turn-on, thereby advantageously preventing radiated noise from being generated. Accordingly, influence on a surrounding circuit during actual use may be minimized.

In addition, the varistor may be separately manufactured and may be coupled to the capacitor and, thus, it may be advantageous that a manufacturing process is simplified and there is not limit in selecting materials.

While exemplary embodiments have been shown and described above, it will be apparent to those skilled in the art that modifications and variations could be made without departing from the scope of the present disclosure as defined by the appended claims.

What is claimed is:

1. A composite electronic component comprising: a capacitor including a capacitor body including a dielectric layer and first and second internal electrodes alternately stacked with the dielectric layer interposed therebetween, and first and second electrodes disposed on the capacitor body; a varistor including a varistor body including ZnO, and third and fourth electrodes disposed on the varistor body; a first external electrode disposed to cover and directly contact the first and third electrodes; and a second external electrode disposed to cover and directly contact the second and fourth electrodes, wherein the first electrode is electrically connected to the third electrode, and the second electrode is electrically connected to the fourth electrode, wherein conductive adhesives are physically disposed between the first and third electrodes and between the second and fourth electrodes, wherein an insulating adhesive is disposed between the capacitor body and the varistor body, wherein the insulating adhesive fills an entire gap between the capacitor body and the varistor body;
wherein first to fourth plating layers are formed on surfaces of the first to fourth electrodes, respectively; and wherein a solder is disposed between the first plating layer and the third plating layer and between the second plating layer and the fourth plating layer; and
wherein the first to fourth plating layers each include a Ni layer disposed on the first to fourth electrodes, respectively, and a Sn layer disposed on the Ni layer.

2. The composite electronic component of claim 1, wherein the first and second external electrodes each include a plating layer.

3. The composite electronic component of claim 1, wherein the first and second external electrodes each include an electrode layer and a plating layer disposed on the electrode layer.

4. The composite electronic component of claim 1, wherein a turn-on voltage standard deviation of the composite electronic component is equal to or less than 50.

5. The composite electronic component of claim 1, wherein a resistance during a turn-on of the composite electronic component is equal to or greater than 100Ω.

6. The composite electronic component of claim 1, wherein the varistor is coupled to the capacitor in a first direction, and
wherein the conductive adhesives include first and second conductive adhesives which are respectively disposed between the first and third electrodes and between the second and fourth electrodes in the first direction.

7. The composite electronic component of claim 6, wherein the insulating adhesive is disposed between the first and second conductive adhesives in a second direction perpendicular to the first direction.

* * * * *